United States Patent
Sato et al.

(10) Patent No.: US 6,815,608 B2
(45) Date of Patent: Nov. 9, 2004

(54) HIGH-VOLTAGE ELECTRIC APPARATUS

(75) Inventors: Takanori Sato, Hitachi (JP); Ryouzou Takeuchi, Hitachi (JP); Hiroyasu Kaga, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/469,643

(22) PCT Filed: Mar. 6, 2002

(86) PCT No.: PCT/JP02/02078

§ 371 (c)(1),
(2), (4) Date: Sep. 3, 2003

(87) PCT Pub. No.: WO02/073636

PCT Pub. Date: Sep. 19, 2002

(65) Prior Publication Data

US 2004/0094327 A1 May 20, 2004

(30) Foreign Application Priority Data

Mar. 7, 2001 (JP) .......................... 2001-062988

(51) Int. Cl.[7] .......................... H01B 17/26; H05K 5/00
(52) U.S. Cl. .................. 174/11 BH; 174/18; 174/31.5; 174/152 R
(58) Field of Search .............................. 174/11 BH, 18, 174/142, 152 R, 31.5

(56) References Cited

U.S. PATENT DOCUMENTS 3,809,794 A * 5/1974 Jacobs .................... 174/11 BH
4,668,037 A * 5/1987 Jouanny ...................... 439/277
5,068,492 A * 11/1991 Britz et al. ................. 174/31.5

FOREIGN PATENT DOCUMENTS

| JP | 51-121158 | 10/1976 |
|---|---|---|
| JP | 56-160719 | 12/1981 |
| JP | 5-190353 | 7/1993 |
| JP | 5-299197 | 11/1993 |
| JP | 6-283299 | 10/1994 |
| JP | 8-179000 | 7/1996 |
| JP | 9-259801 | 10/1997 |
| JP | 10-134659 | 5/1998 |
| JP | 11-275720 | 10/1999 |
| JP | 2000-90843 | 3/2000 |

* cited by examiner

*Primary Examiner*—Hung V. Ngo
(74) *Attorney, Agent, or Firm*—Dickstein Shapiro Morin & Oshinsky LLP

(57) ABSTRACT

Sufficient dielectric strength needs to be ensured for the high voltage connection (13-11) of the high voltage electrical equipment such as a pattern generation system for focused ion beam processing and observation (1), without enlarging the equipment.

The present invention seals an insulating liquid (13-113a) or gas (13-113b) in the space (13-113) between the connection bushing on the power supply side (13-111) and the flange on the power receiving side (13-112), and applies the water repellent treatment (13-111c) to a surface of the connection bushing or flange on the power receiving side, which the surface faces the space (13-113).

Such a configuration provides compact electrical equipment with high dielectric strength, which can prevent the condensation or moisture absorption on the insulation surface in the space of the high voltage connection and can prevent the leakage current increase even under high humidity environment.

10 Claims, 7 Drawing Sheets

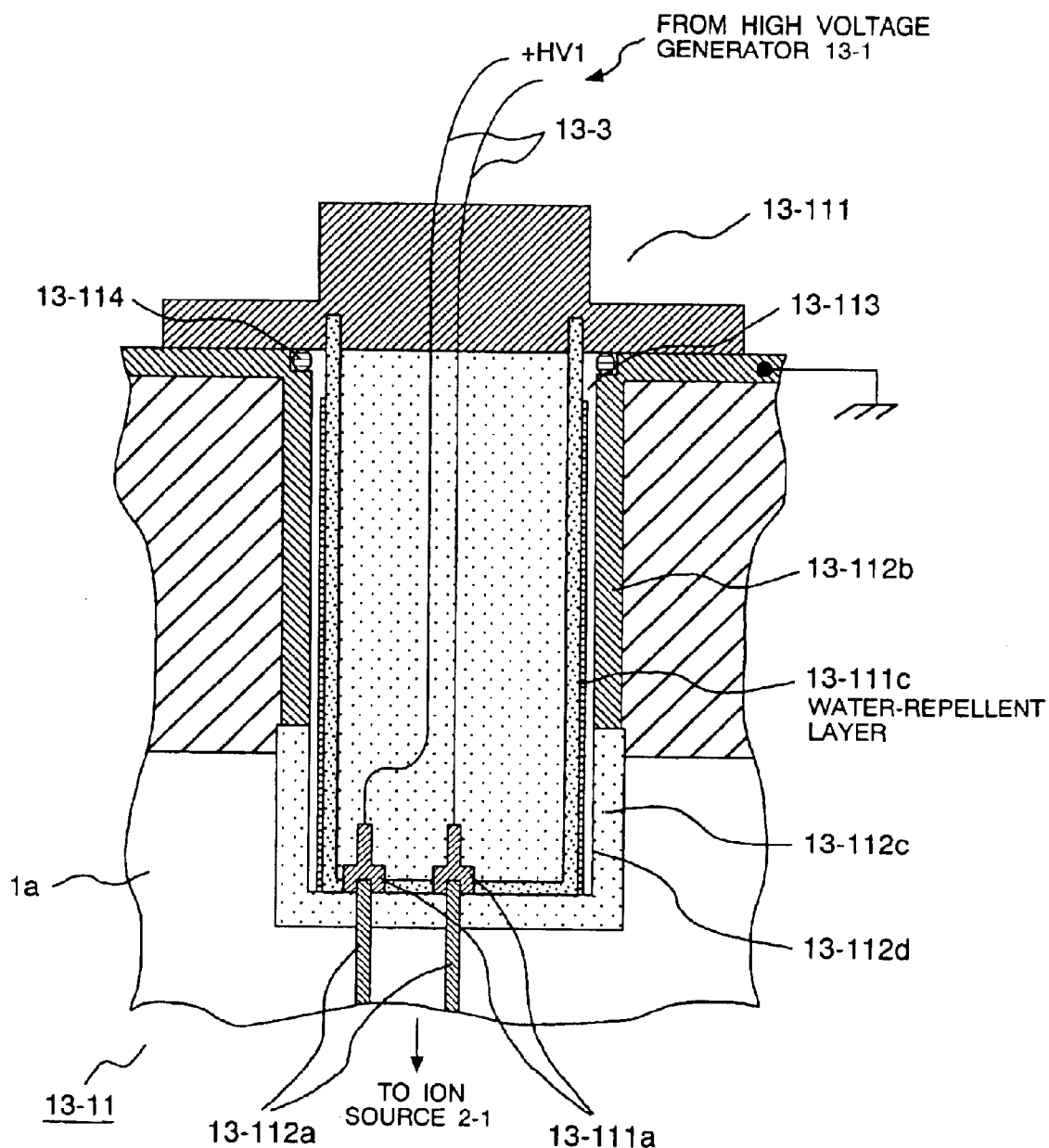

HIGH-VOLTAGE ELECTRIC APPARATUS

FIELD OF THE INVENTION

The present invention relates to high voltage electrical equipment, such as a focused ion beam processing and observation system, to which high voltage is applied to accelerate ions or charged particles.

BACKGROUND OF THE INVENTION

Electrical equipment with a high voltage portion of 20 [kV] or more, such as a focused ion beam processing and observation system, has a structure in which the vacuum container body and the high voltage power supply are separable to help the maintenance of the body. In such high voltage electrical equipment, the dielectric strength of the electrical connection between the power supply side and the body side is important.

Conventional techniques for improving the dielectric strength include, for example, providing a space in the electrical connection between the power supply side and the body side to increase the creepage distance. As another conventional technique, filling of transformer oil having high dielectric strength into the windings to which high voltage is applied has been proposed for a transformer of the power supply, as described by Japanese Application Patent Laid-Open Publication Nos. Hei 05-190353, Hei 05-299197, and Hei 06-283299.

In the above-described conventional technique that provides a space around the high voltage connection to increase the creepage, keeping the given dielectric strength needs sufficient distance dimension and creepage, which may enlarge the electrical equipment body. In addition, changes in the environment around the electrical equipment may cause condensation or moisture absorption on the high voltage insulation surface. Thus, more leakage current may pass through the insulator to reduce its dielectric strength so that it was difficult to provide compact electrical equipment.

SUMMARY OF THE INVENTION

The object of the present invention is to provide reliable electrical equipment which can prevent the leakage current increase due to the condensation or moisture absorption on the high voltage insulation surface and improve the dielectric strength, and can be made compact.

In accordance with one aspect of the present invention, there is provided high voltage electrical equipment including a bushing terminal which connects to an electric wire for supplying high voltage electricity, a connection bushing which holds the bushing terminal, and a flange on a power receiving side in which the connection bushing is detachably fitted and which has a flange terminal to be connected to the bushing terminal, comprising, an insulating liquid sealed in a space between the connection bushing and the flange on the power receiving side, the space being formed when the connection bushing is attached to the flange on the power receiving side.

The insulating liquid is preferably a fluorine-based insulating liquid which has dissolved water of 50 [ppm] or less at 40 [° C.].

In accordance with another aspect of the present invention, the high voltage electrical equipment comprises an insulating gas sealed in a space between the connection bushing and the flange on the power receiving side, the space being formed when the connection bushing is attached to the flange on the power receiving side.

The insulating gas is preferably dry nitrogen, dry air, or dry carbon dioxide which has a water content of 300 [ppm] or less with a dew point of −40 [° C.], and insulation equal to or higher than that of the air.

In accordance with still another aspect of the present invention, a water repellent treatment including a fluorine-based resin material is applied to a surface of the connection bushing, which the surface faces the space.

Such a configuration can prevent the condensation or moisture absorption on the insulator surface in the space of the high voltage connection, and can prevent the leakage current increase even under high humidity environment, and can provide compact equipment with high dielectric strength.

The high voltage electrical equipment includes an electron source such as an electron microscope, or an ion source, and can apply to and is suited for electronic devices that process and observe samples with accelerated ion beams.

BRIEF DESCRIPTION OF THE DRAWINGS

FIG. 7 shows a longitudinal sectional view around the high voltage connection according to a third embodiment of the present invention.

DESCRIPTION OF THE PREFERRED EMBODIMENTS

Embodiments of the present invention will be described below referring to the appended drawings.

First Embodiment

Figure 1:
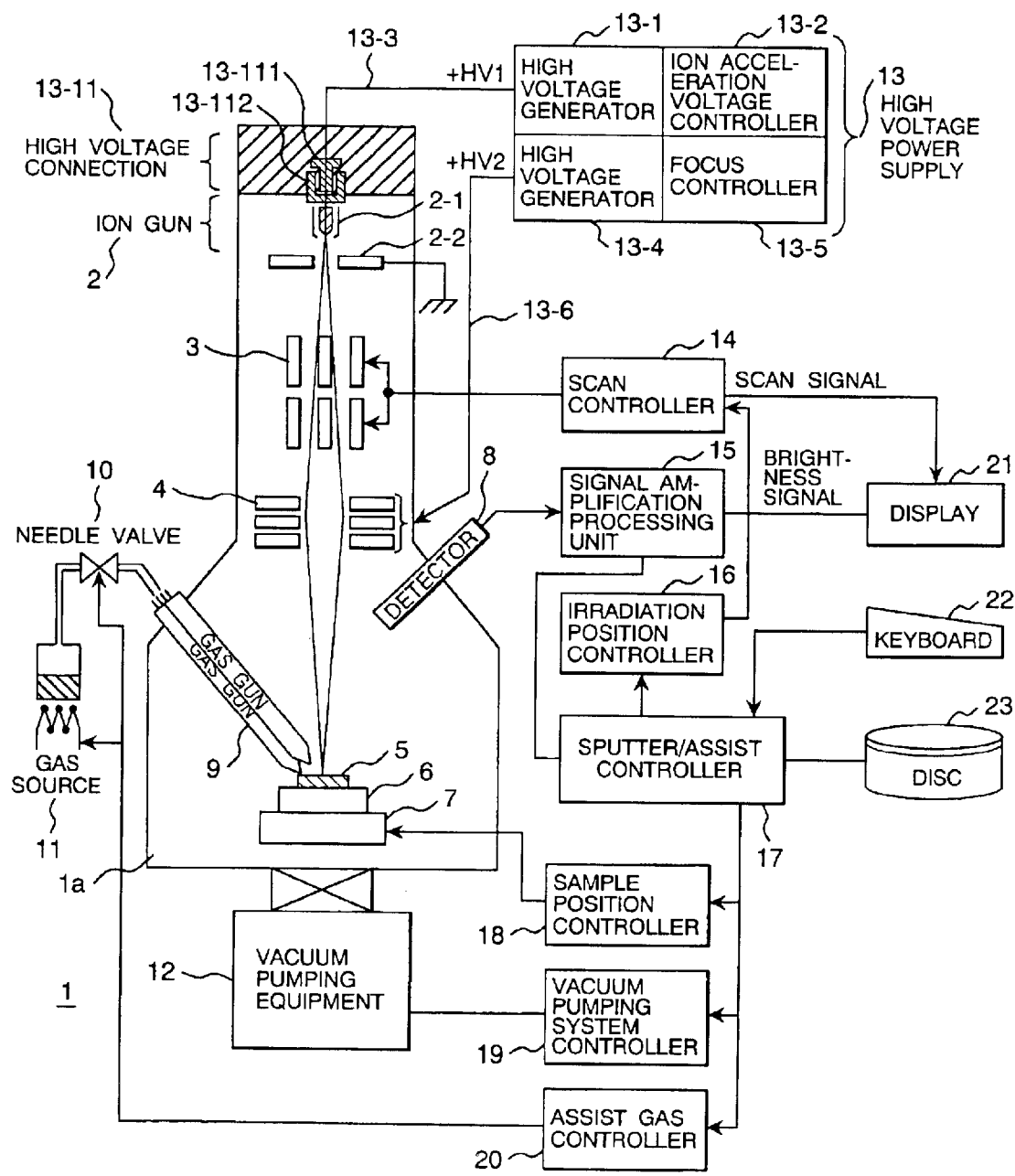
FIG. 1 shows a schematic block diagram of a pattern generation system for focused ion beam processing and observation as the high voltage equipment according to a first embodiment of the present invention.

FIG. 1 shows a schematic block diagram of the pattern generation system for focused ion beam processing and observation as the high voltage equipment according to a first embodiment of the present invention. Number 1 is the pattern generation system, 2 is an ion gun, 2-1 is an ion source, 2-2 is an electrode, 3 is a deflecting electrode, 4 is an objective lens, 5 is a sample, 6 is a sample stage, 7 is a sample motion mechanism, 8 is a detector, 9 is a gas gun for spraying assist gas, 10 is a needle valve, 11 is a gas source, and 12 is a vacuum pumping system.

Number 13 is a high voltage power supply, 13-1 is a high voltage generator for accelerating ions, and 13-2 is an ion acceleration voltage controller. Number 13-3 is a high voltage cable for sending a positive high voltage current (+HV1) generated by the high voltage generator 13-1. Number 13-4 is a high voltage generator for focusing ions, 13-5 is a focus controller. Number 13-6 is a high voltage cable for sending a positive high voltage current (+HV2) generated by the high voltage generator 13-4. Number 14 is a operation controller, 15 is a signal amplification processing unit, 16 is an irradiation position controller, 17 is a sputter/ assist controller, 18 is a sample position controller, 19 is a vacuum pumping system controller, 20 is an assist gas controller, 21 is a display, 22 is a keyboard, and 23 is a disc.

As a main function of the system, configuration and operation will be described for indicating on the display 21 as SIM ( ) images the charged particles, such as secondary electrons, emitted from the sample that is irradiated by ion beams.

The high voltage generator for accelerating ions 13-1 applies a positive high voltage (+HV1) to the ion source 2-1 via a high voltage connection 13-11. For example, a needle type ion source 2-1 that has a sharp end and includes gallium produces a gallium ion beam by field evaporating liquid gallium. This ion beam passes through the electrode 2-2, which has a hole on the axis and is grounded, thereby forming the ion gun 2. The ion acceleration voltage controller 13-2 sets the accelerating voltage for accelerating the gallium ion beam. The objective lens 4 focuses the produced gallium ion beam onto the sample 5 mounted on the sample stage 6 (to form an image). The deflecting electrode 3 scans the ion beam over the sample 5. The detector 8 detects secondary electrons and the like, emitted from the sample 5 and provides signals to the signal amplification processing unit 15. The objective lens 4 focuses the gallium ion beam onto the sample 5 by receiving via the high voltage cable 13-6 the positive high voltage (+HV2) generated by the high voltage generator 13-4 according to the signal from the focus controller 13-5. The signal amplification processing unit 15 performs amplification, processing, and the like, of the provided signals and then indicates the signals on the display 21 as, for example, SIM images. The SIM images are displayed at a magnification that depends on the scan signal magnitude, which the scan controller 14 applies to the deflection electrode 3. The sample 5 is observed on the display 21 at a position controlled by the sample stage 6 which is moved by the sample motion mechanism 7, either in response to the instruction from the sample position controller 18 or via a manual mechanism (not shown). The inside of the sample chamber and the like forming the pattern generation system 1 and the area through which the gallium ion beam passes are in a vacuum space 1a, which the vacuum pumping equipment 12 evacuates to an ultra high vacuum in response to the instruction from the vacuum pumping system controller 19.

The above-described configuration and operation make possible to observe the SIM images of the sample 5. Although not described in detail, the same operation as described above can also accurately determine the necessary position in laminating a conductive pattern and a new insulating pattern.

Figure 2:
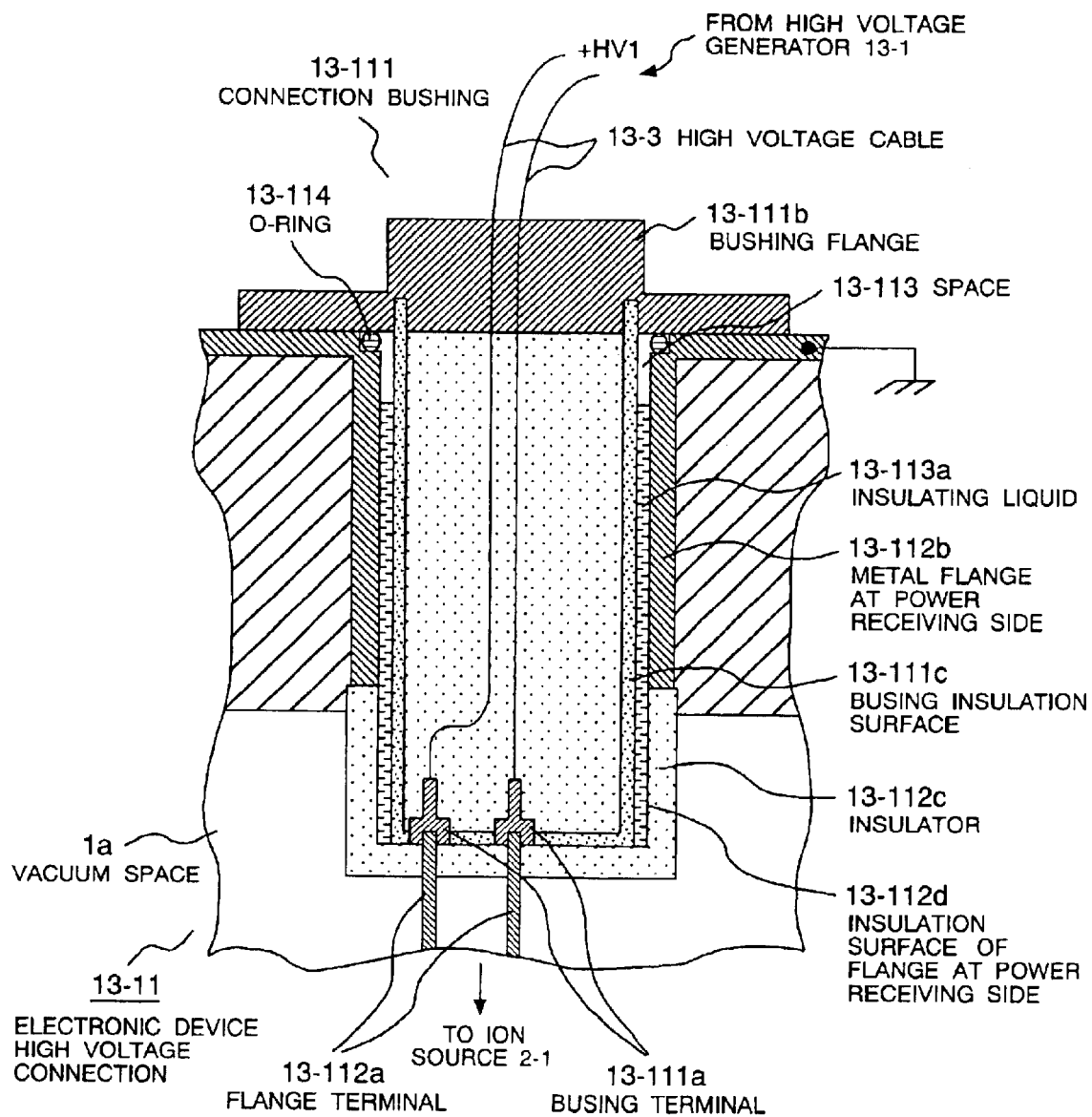
FIG. 2 shows a longitudinal sectional view around the high voltage connection according to the first embodiment.

FIG. 2 shows a longitudinal sectional view around the high voltage connection 13-11 according to a first embodiment of the present invention. The voltage connection 13-11 provides electrical connection in order to apply to the ion source 2-1 the high voltage current generated by the above-described high voltage generator for accelerating ions 13-1. The high voltage from the high voltage generator for accelerating ions 13-1 is applied via the high voltage cable 13-3 to the bushing terminal 13-111a of the connection bushing on the power supply side 13-111. This high voltage is applied to the flange terminal 13-112a of the flange on the power receiving side 13-112, which is closely connected to the bushing terminal 13-111a, and is then led to the ion source 2-1 as shown in FIG. 1. The flange on the power receiving side 13-112 has an upper part which is formed by a metal flange 13-112b and is grounded. The flange 13-112 also has a lower part which is formed by an insulator 13-112c which insulates the ground potential of the metal flange 13-112b and the high voltage applied to the flange terminal 13-112a. The high voltage is applied across the bushing terminal 13-111a or flange terminal on the power receiving side 13-112a and the metal flange 13-112b. A space 13-113 of about 1 mm intervenes between the connection bushing 13-111 on the power supply side and the flange on the power receiving side 13-112. Part or almost all of this space 13-113 is filled with an insulating liquid 13-114 containing a small amount of dissolved water. An O-ring 13-114 seals the insulating liquid 13-113a from the outside air.

Now the summary of the high voltage electrical equipment will be collectively described below.

The vacuum space 1a of the vacuum container contains the power receiving device or electronic device which includes the ion gun 2, ion source 2-1, electrode 2-2, deflecting electrode 3, objective lens 4, sample 5, sample stage 6, sample motion mechanism 7, detector 8, gas gun for spraying assist gas 9, needle valve 10, and gas source 11. The connection bushing 13-111 holds the high voltage cable 13-3 of electric wire which supplies high voltage electricity to the power receiving device which includes the connection bushing 13-111 and the flange on the power receiving side 13-112. This connection bushing 13-111 is detachably fitted in the flange on the power receiving side 13-112 provided in the above-described container. This fitting detachably connects the busing terminal 13-111a, which is provided in the above-described connection bushing 13-111 and connects to the cable 13-1, and the flange terminal 13-112a, which is provided in the flange on the power receiving side 13-112 and leads the electricity to the above-described power-receiving device. This fitting or detaching and connecting operation is performed when the above-described connection bushing 13-111 is attached to/removed from the above-described power receiving device.

The insulating liquid 13-113a, which contains a small amount of dissolved water, is filled in such that the liquid exists in the space 13-113 between the above-described connection bushing 13-111 and the above-described flange on the power receiving side 13-112, which the space is formed when the connection bushing 13-111 is attached to the flange on the power receiving side 13-112. Number 13-111b indicates a bushing flange, and 13-111c indicates a bushing insulation surface.

As described above, the first embodiment provides high voltage electrical equipment 1 which includes the bushing terminal 13-111a which connects to the electric wire 13-3 for supplying high voltage electricity, the connection bushing 13-111 which holds the bushing terminal, and the flange on the power receiving side 13-112 in which the connection bushing is detachably fitted and which has the flange terminal 13-112a to be connected to the bushing terminal, wherein the fluorine-based insulating liquid 13-113a which contains dissolved water of 50 [ppm] or less at 40 [° C.] is sealed in the space 13-113 between the connection bushing and the flange on the power receiving side, the space being formed when the connection bushing is attached to the flange on the power receiving side.

Thus, the insulating liquid 13-113a, which exists in the space 13-113 around the high voltage connection for connecting the bushing 13-111a and the flange terminal 13-112a, can prevent the leakage current increase due to the condensation or moisture absorption and the resultant reduction of the dielectric strength. That is, the insulating liquid can prevent the leakage current increase and can improve the dielectric strength and reliability, even when the maintenance work of the pattern generation system 1 body is carried out in a high humidity ambient atmosphere, and when the connection bushing 13-111 is brought out into the outside air to cause the condensation or moisture absorption on the bushing insulation surface 13-111c.

Figure 3:
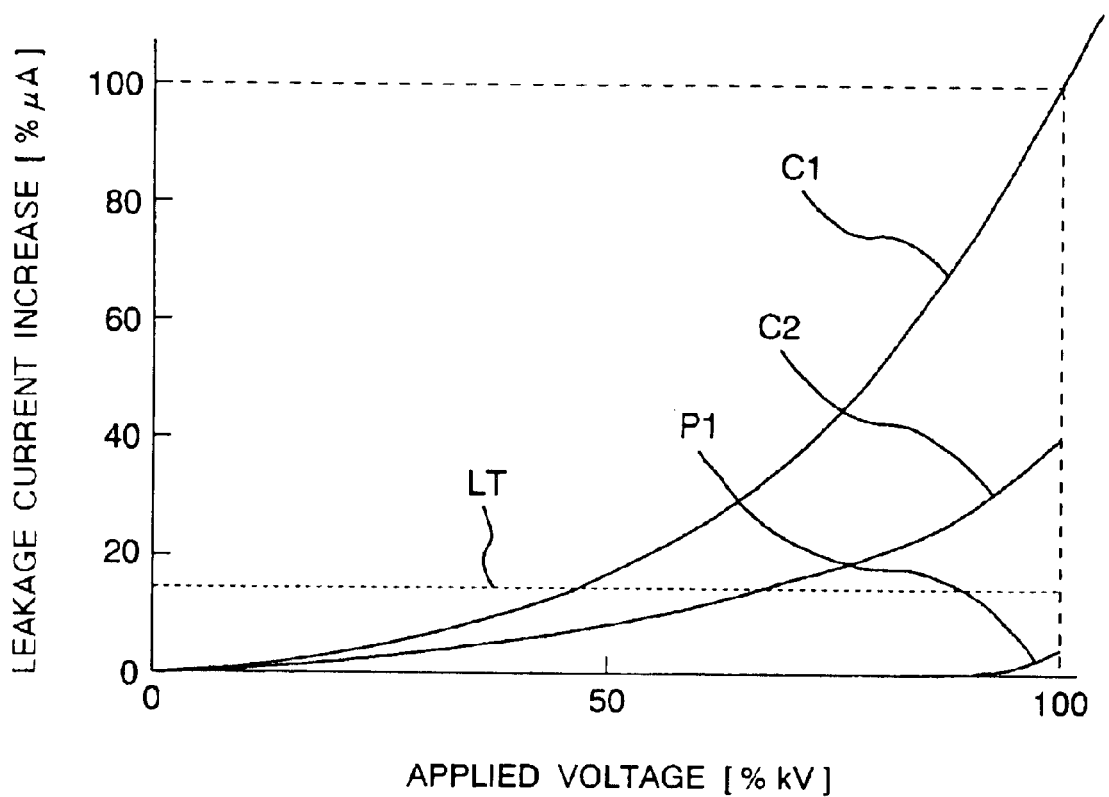
FIG. 3 shows a characteristic diagram for the effect of the first embodiment.

FIG. 3 is an illustration for the effect of the present embodiment and shows the relationship between the applied voltage and the leakage current under high humidity. In FIG. 3, the temperature and humidity are supposed to be the highest temperature and humidity conditions during the maintenance work. The bushing on the power supply side 13-111 and the flange on the power receiving side 112 are separated and exposed to atmosphere of 40 [° C.] and 90% RH for 10 minutes, and then assembled and connected in the same atmosphere. The applied voltage in this case indicates 100% when it is the rated voltage. The leak current indicates 100% for the leak current increase that occurs when the above described rated voltage is applied across the space 13-113 in which nothing is filled, which is a first comparative example C1. The characteristic curve P1 according to the present embodiment is where a fluorine-based insulating liquid (C8H16: FC-75 available from Sumitomo 3M), which has an amount of dissolved water of 11 [ppm] and the volume resistance of $8 \times 10^{15}$ [[Ω-cm]], is filled in as the insulating liquid 13-113a having a small amount of dissolved water. The comparative examples include two types of the characteristic curves: the characteristic curve C1 in the first comparative example where nothing is filled in the space 13-113 as described above, and the characteristic curve C2 in the second comparative example where the transformer oil is filled in the space. The measured leakage current increase is indicated as the current through the HV1 when DC voltage is applied up to the rated voltage. The symbol LT indicates the limit for the partial breakdown.

In FIG. 3, it is apparent that the characteristic curve P1 according to the embodiment of the present invention generates significantly lower leakage current increase or little leakage current increase, compared to the characteristic curve C1 in the first comparative example or the characteristic curve C2 in the second comparative example. In the above example, the insulating liquid 13-113a is preferably filled in up to the position over the boundary between the metal flange on the power receiving side 13-112b and the insulation surface of the flange on the power receiving side 13-112d.

Figure 4:
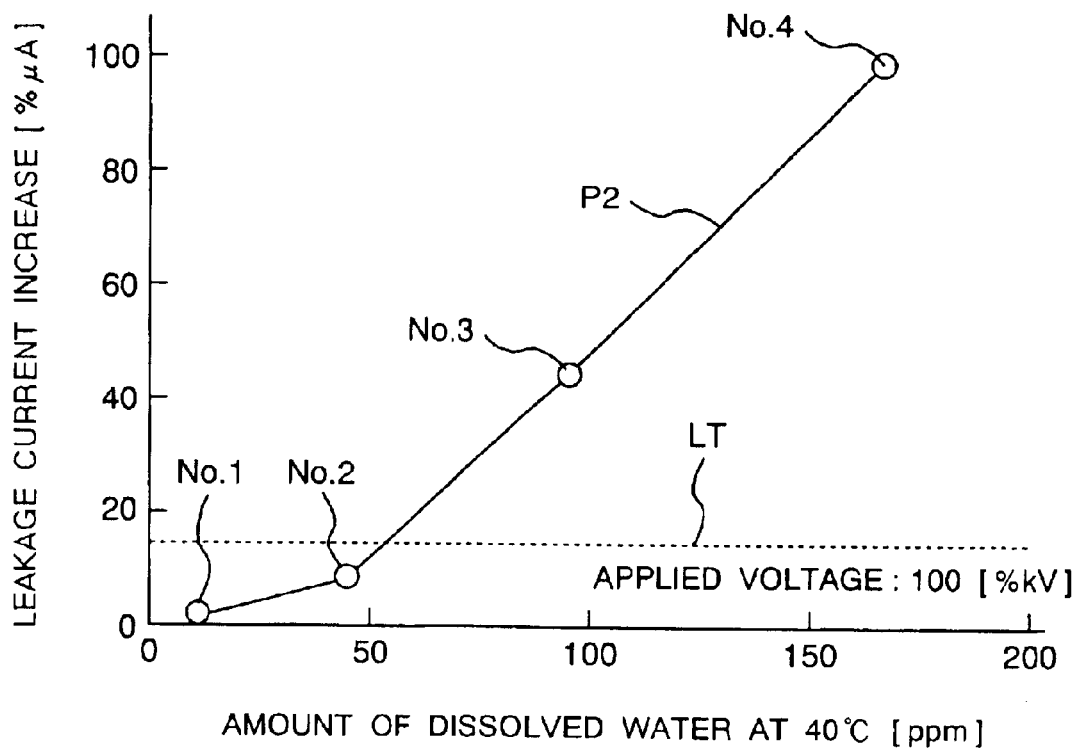
FIG. 4 shows another characteristic diagram for the effect of the first embodiment.

FIG. 4 shows the relationship P2 between the leakage current increase and the amount of water dissolved in the different types of the insulating liquids according to the present invention. Four different types of the insulating liquids from No. 1 to 4 with different amounts of dissolved water are filled in the space 13-113. The insulating liquids No. 1 and No. 2 are fluorine-based insulating liquids with different amounts of dissolved water. The liquid No. 3 is the above-described transformer oil. The liquid No. 4 is silicone oil. The leakage current is measured in the same condition as in FIG. 3 and shows the leakage current increase when the applied voltage is the rated voltage. As shown in FIG. 4, the leakage current increases significantly for the insulating liquids having about 50 [ppm] or more of the dissolved water (here the transform oil). In this case, the insulating liquid 13-113a needs to have dissolved water of 50 [ppm] or less because the leakage current of about 15 [%µA] or more may cause a breakdown on the bushing insulation surface 13-111c which causes a partial carbon path on the surface.

In addition, the insulating liquid 13-113a according to the first embodiment preferably has insulating properties including breakdown voltage of about 10 [kV/mm] or more and volume resistance of $1 \times 10^{12}$ [Ω-cm] or more. For the insulating properties less than such values, the leakage current of about 15 [%µA] may occur at a condition lower than the above-described exposure condition to cause the partial breakdown.

Second Embodiment

Figure 5:
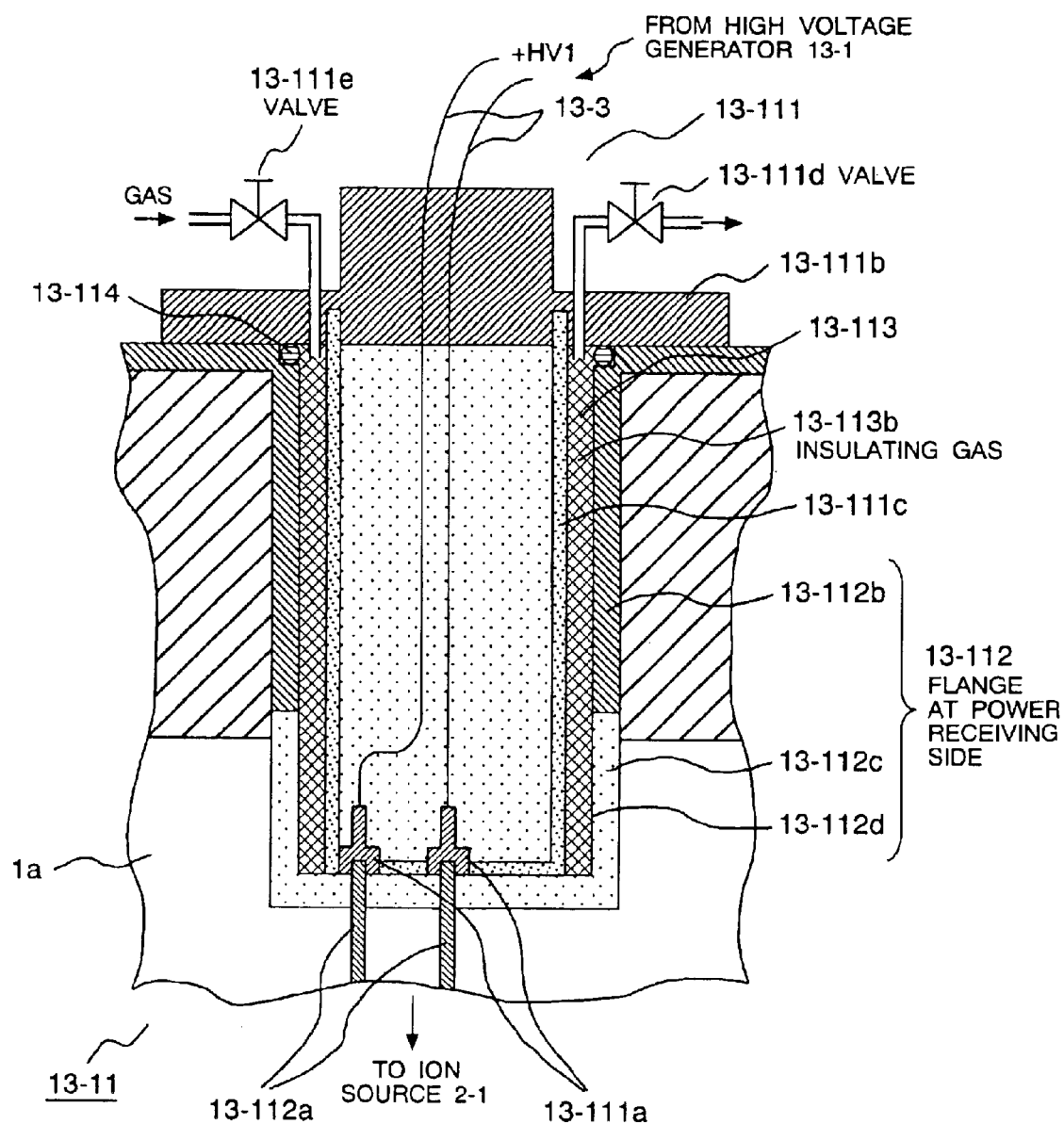
FIG. 5 shows a longitudinal sectional view around the high voltage connection according to a second embodiment of the present invention.

FIG. 5 shows a sectional view around the high voltage connection 13-11 corresponding to the one in FIG. 2 as a second embodiment of the present invention. In the present embodiment, the bushing flange 13-111b has valves 13-111d and 13-111e. An external insulating gas 13-113b with a small water content is filled in the space 13-113 through the valve 13-111e and is sealed with both the valves closed. Dry nitrogen (water content: 126 [ppm] with a dew point of −40 [° C.]) is used as an example of the insulating gas 13-113b. The dry nitrogen is filled up to a pressure equal to or higher than the atmospheric pressure and is then sealed.

This second embodiment provides high voltage electrical equipment which includes the bushing terminal 13-111a which connects to the electric wire 13-3 for supplying high voltage electricity, the connection bushing 13-111 which holds the bushing terminal, and the flange on the power receiving side 13-112 in which the connection bushing is detachably fitted and which has the flange terminal 13-112a to be connected to the bushing terminal, comprising, an insulating gas 13-113b, such as dry nitrogen, dry air, or dry carbon dioxide gas, which has a water content of 300 [ppm] or less with a dew point of −40 [° C.], and insulation equal to or higher than that of the air (the breakdown voltage is 2 [kV/mm] or more), and which is sealed in the space 13-113 between the connection bushing and the flange on the power receiving side, the space being formed when the connection bushing is attached to the flange on the power receiving side.

In the present embodiment, the space 13-113 is filled with dry nitrogen 13-113b having a small water content, which will adsorb the water adsorbed on the bushing insulation surface 13-113b. Thus, the insulation of the bushing insulation surface 13-111c can keep the given dielectric strength to prevent the leakage current increase.

Figure 6:
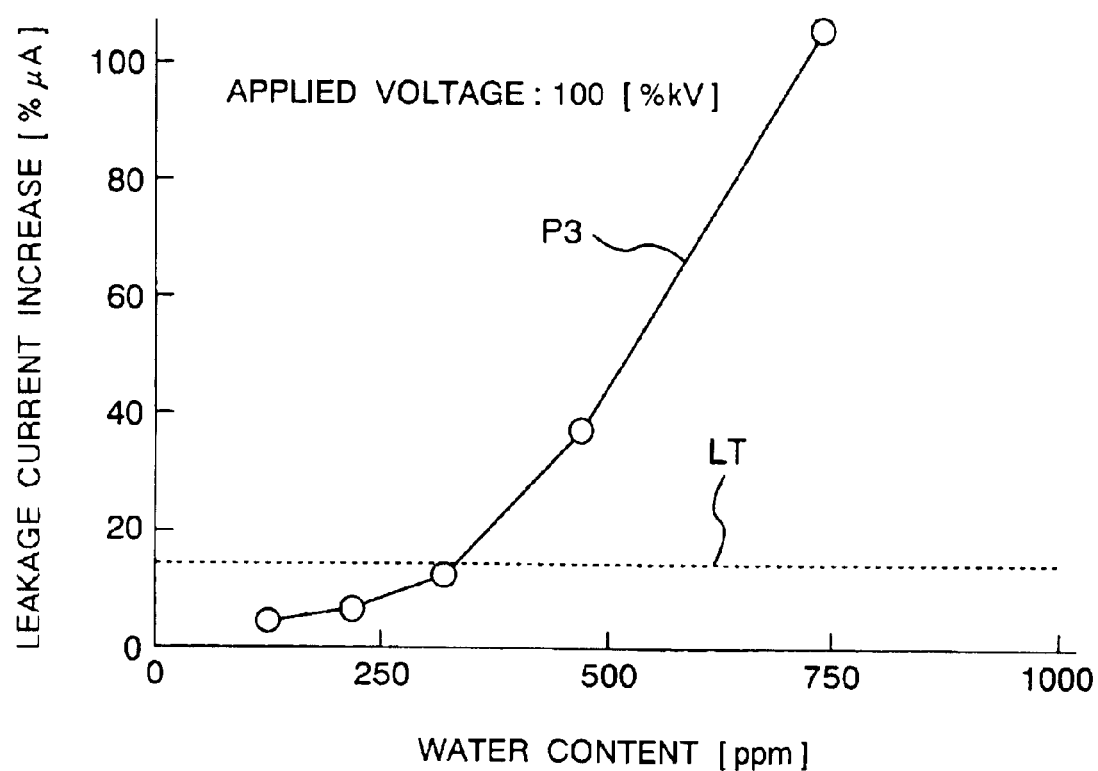
FIG. 6 shows a characteristic diagram for the effect of the second embodiment.

FIG. 6 shows the relationship P3 between the leakage current and the water content with the dew point of −40 [° C.] for nitrogen gases having different water contents filled in the space 13-113. The leakage current is measured in the same condition as in FIGS. 3 and 5. The nitrogen gas to be filled preferably has a water content of about 300 [ppm] or less because the water content of about 300 [ppm] or more may cause a leakage current increase of 15 [%µA] or more.

In addition, although the dry nitrogen is filled in the space 13-113 in the present embodiment, any insulating gas 13-113b other than the dry nitrogen, such as dry air or dry carbon dioxide gas, and mixed gas thereof, which has a water content of about 300 [ppm] or less with the dew point of −40 [° C.], can provide the same effect.

Third Embodiment

FIG. 7 shows a sectional view around the high voltage connection 13-11 corresponding to the one in FIG. 2 as another embodiment of the present invention. In the present embodiment, a water repellent treatment is applied to the surface 13-111c of the connection bushing 13-111, which the surface 13-111c faces the space 13-113. In other words, the present embodiment comprises a water-repellent layer 13-111c which is coated with materials having great water repellency, such as fluorocarbon resin coating agent.

According to the present embodiment, even when water adheres to the bushing insulation surface due to the condensation or moisture absorption, the bushing insulation surface which includes the water-repellent layer 13-111c having great water repellency can prevent the water diffusion. Thus, the insulation of the bushing insulation surface can keep the given dielectric strength to prevent the leakage current increase.

Although the bushing insulation surface is provided with the coating 13-111c of materials having great water repellency in this embodiment, the insulation surface of the flange on the power receiving side 13-112d can also be provided with the coating, thereby providing significantly more effect.

The first to third embodiments have been described respectively as an independent embodiment, but these embodiments can be combined.

In addition, although these embodiments have been described for the application to the high voltage connection 13-11 for the ion acceleration voltage controller 13-2 in the pattern generation system for focused ion beam processing and observation as shown in FIG. 1, it is apparent that the embodiments can also apply to the high voltage connection for the focus controller 13-5 (not shown).

The effect of the Invention

The present invention can provide high voltage electrical equipment which can prevent the leakage current increase due to the condensation or moisture absorption on the insulation surface, and can prevent the associated reduction of the dielectric strength and can be made compact, by filling the space around the high voltage connection of the electrical equipment with an insulating liquid or gas which does not easily cause the condensation or the moisture absorption, or by coating the insulation surface which faces the space with a water repellent material.

What is claimed is:

1. High voltage electrical equipment including a bushing terminal which connects to an electric wire for supplying high voltage electricity, a connection bushing which holds the bushing terminal, a flange on a power receiving side in which the connection bushing is detachably fitted and which has a flange terminal to be connected to the bushing terminal, and an insulating liquid sealed in a space between the connection bushing and the flange on the power receiving side, the space being formed when said connection bushing is attached to said flange on a power receiving side, wherein, an insulating liquid has dissolved water of 50 ppm or less at 40° C.

2. The high voltage electrical equipment of claim 1, wherein said insulating liquid is a fluorine-based insulating liquid.

3. High voltage electrical equipment including a bushing terminal which connects to an electric wire for supplying high voltage electricity, a connection bushing which holds the bushing terminal, and a flange on a power receiving side in which the connection bushing is detachably fitted and which has a flange terminal to be connected to the bushing terminal, comprising, an insulating gas which has a water content of 300 ppm or less with a dew point of −40° C., and insulation equal to or higher than that of air, and which is sealed in a space between the connection bushing and the flange on the power receiving side, the space being formed when said connection bushing is attached to said flange on a power receiving side.

4. High voltage electrical equipment including a bushing terminal which connects to an electric wire for supplying high voltage electricity, a connection bushing which holds the bushing terminal, and a flange on a power receiving side in which the connection bushing is detachably fitted and which has a flange terminal to be connected to the bushing terminal, comprising, an insulating gas which has a breakdown voltage of 2 kV/mm or more, and which is sealed in a space between the connection bushing and the flange on the power receiving side, the space being formed when said connection bushing is attached to said flange on a power receiving side.

5. The high voltage electrical equipment of claim 4, wherein said insulating gas has a water content of 300 ppm or less with a dew point of −40° C.

6. High voltage electrical equipment including a bushing terminal which connects to an electric wire for supplying high voltage electricity, a connection bushing which holds the bushing terminal, and a flange on a power receiving side in which the connection bushing is detachably fitted and which has a flange terminal to be connected to the bushing terminal, comprising, dry nitrogen, dry air, or dry carbon dioxide gas which is sealed in a space between the connection bushing and the flange on the power receiving side, the space being formed when said connection bushing is attached to said flange on a power receiving side.

7. The high voltage electrical equipment of any one of claims 1 and 3 to 6, wherein a water repellent treatment is applied to a surface of the connection bushing, which the surface faces the space.

8. The high voltage electrical equipment of claim 7, wherein said water repellent treatment material includes a fluorine-based resin material.

9. The high voltage electrical equipment of any one of claims 1 and 3 to 6, wherein said high voltage electrical equipment comprises an electronic device including an electron source such as an electron microscope, or an ion source.

10. The high voltage electrical equipment of any one of claims 1 and 3 to 6, wherein said high voltage electrical equipment comprises an electronic device that processes and observes samples with accelerated ion beams.

* * * * *